United States Patent
Becker et al.

(10) Patent No.: US 8,660,757 B2
(45) Date of Patent: Feb. 25, 2014

(54) METHOD AND CONTROL DEVICE FOR TRIGGERING PASSENGER PROTECTION MEANS FOR A VEHICLE

(75) Inventors: Jens Becker, Stuttgart (DE); Marcus Hiemer, Kehlen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 13/138,052

(22) PCT Filed: Nov. 23, 2009

(86) PCT No.: PCT/EP2009/065615
§ 371 (c)(1),
(2), (4) Date: Sep. 22, 2011

(87) PCT Pub. No.: WO2010/081580
PCT Pub. Date: Jul. 22, 2010

(65) Prior Publication Data
US 2012/0004811 A1    Jan. 5, 2012

(30) Foreign Application Priority Data

Jan. 13, 2009   (DE) .......................... 10 2009 000 160

(51) Int. Cl.
*B60R 21/01*   (2006.01)
*B60R 21/013*  (2006.01)
*H03M 7/30*    (2006.01)
*H03M 13/00*   (2006.01)

(52) U.S. Cl.
CPC .............. *B60R 21/013* (2013.01); *H03M 7/30* (2013.01); *H03M 13/658* (2013.01)
USPC ........................................................... 701/45

(58) Field of Classification Search
None
See application file for complete search history.

(56) References Cited

U.S. PATENT DOCUMENTS

| | | | |
|---|---|---|---|
| 5,961,562 A * | 10/1999 | Iyoda .............................. | 701/45 |
| 6,513,055 B1 * | 1/2003 | Boran ............................ | 708/551 |
| 6,885,966 B1 * | 4/2005 | Tyroller et al. ............... | 702/138 |
| 7,164,979 B2 * | 1/2007 | Kumazawa ..................... | 701/45 |
| 8,249,779 B2 * | 8/2012 | Rauh et al. ..................... | 701/45 |
| 2010/0017065 A1 * | 1/2010 | Weiss ............................. | 701/45 |

FOREIGN PATENT DOCUMENTS

| | | |
|---|---|---|
| DE | 100 20 084 | 11/2001 |
| DE | 102 37 162 | 2/2004 |
| DE | 10 2005 024 319 | 12/2006 |
| DE | 10 2006 038 844 | 2/2008 |

(Continued)

OTHER PUBLICATIONS

Tran, "M-channel linear phase perfect reconstruction filter bank with rational coefficients", IEEE Transactions on Circuits and Systems I: Fundamental Theory and Applications, vol. 49, No. 7, Jul. 2002, pp. 914-927.*

(Continued)

*Primary Examiner* — John R Olszewski
*Assistant Examiner* — Todd Melton
(74) *Attorney, Agent, or Firm* — Kenyon & Kenyon LLP

(57) ABSTRACT

A method and a control device for triggering passenger protection means for a vehicle are provided, at least one sensor signal from an accident sensor system being provided by an interface. Furthermore, at least two characteristics are generated from the sensor signal, which are mapped onto one single value range. The triggering of the passenger protection means occurs as a function of the at least two mapped characteristics.

33 Claims, 4 Drawing Sheets

(56) References Cited

FOREIGN PATENT DOCUMENTS

| DE | 10 2007 004 345 | 7/2008 |
|---|---|---|
| EP | 1 034 098 | 2/2004 |
| JP | 04-340627 | 11/1992 |

OTHER PUBLICATIONS

Hastie et al.: T. Hastie, R. Tibshirani, J. Friedman; The elements of statistical learning—Data mining , , Inference and Prediction, Springer Verklag Berlin, 2001, pp. 1-32.

* cited by examiner

METHOD AND CONTROL DEVICE FOR TRIGGERING PASSENGER PROTECTION MEANS FOR A VEHICLE

BACKGROUND OF THE INVENTION

1. Field of the Invention

The present invention relates to a method and a control device for triggering passenger protection means for a vehicle.

2. Description of Related Art

Published German patent application document DE 10 2007 004 345 A1 describes a method for triggering passenger protection means, in which at least one characteristic is extracted from at least one variable and the triggering decision is made as a function of a crash classification, the crash classification occurring as a function of the at least one characteristic. The passenger protection means are triggered as a function of this triggering decision. The triggering decision is formed in that a sequence control is provided, which activates or deactivates a plurality of functions for the crash classification as a function of at least one curve variable, and/or determines which characteristic is used as the at least one characteristic for the respective function. The curve variable may be the time from the crash start or the characteristic or an event, for example.

BRIEF SUMMARY OF THE INVENTION

In contrast, the method according to the present invention and the control device according to the present invention for triggering passenger protection means for a vehicle have the advantage that now the at least two characteristics that were formed from the at least one sensor signal are mapped onto one single value range. The triggering decision is formed as a function of at least these two mapped characteristics. This single value range for the at least two characteristics allows for the individual characteristics to be weighted equally, which allows for a better classification of a crash event, in particular if more than two characteristics, i.e., three dimensions or more dimensions, are considered. That is, the same weighting influences the evaluation of these characteristics that are mapped onto the single value range. This improves the classification in so-called machine-learning-based methods such as neural networking, fuzzy logic, vector quantization, maximum likelihood methods, and support vector machines, as well as other such machine-learning-based methods, in particular. With regard to machine-learning-based methods, reference is made to a publication by Hastie et al: T. Hastie, R. Tibshirani, J. Friedman; The elements of statistical learning—Data mining, Inference and Prediction, Springer Verlag Berlin, 2001.

Furthermore, this single value range for the characteristics used allows for a flexible exchange of the characteristics without having to take into account the value range of these individual characteristics. For example, if one characteristic does not make a sufficient contribution to the algorithm performance, such an exchange may result in an improvement of the functionality.

The particular advantage of equally weighted characteristics for learning-based methods is that such learning-based methods use the statistical properties of a signal. One of these properties is the signal variance, for example. If the value range of one characteristic is significantly greater than that of another, then these statistical properties are distorted. The best results are achieved by a corresponding normalizing, to a value range of −1 to +1, for example. It is furthermore advantageous to use a range of 0 to 1, since the algorithm characteristics that are used in the case at hand are predominantly positive and thus one bit may be saved in the value range in comparison to the range of −1 to +1, so that it is possible to use a better resolution. In particular, the present method may also be optimized for computer resources such as run time, RAM use, ROM use, and primarily for EEPROM use. This is possible despite a high accuracy.

Furthermore, the method according to the present invention and the control device according to the present invention make it possible to freely select the accuracy.

In the case at hand, triggering of passenger protection means can be understood as the activation of such passenger protection means, for example, the supply of power to ignition elements of airbags, which result in their ignition and thus in the inflation of such an airbag. Thus, passenger protection means can also be understood to mean passive passenger protection means such as airbags, belt pretensioners, roll bars, head rests, but also active passenger protection means such as a driving dynamics control system or also a brake system.

In the case at hand, providing the at least one sensor signal of an accident sensor system is understood to mean the supply of the at least one sensor signal.

The at least one sensor signal of an accident sensor system may be analog or digital signals, or a multiplex of signals. The accident sensor system may be an acceleration sensor system, an air-pressure sensor system, a surroundings sensor system such as a radar, video, and/or ultrasound sensor system, and a structure-borne noise sensor system, for example.

Generating the at least two characteristics from the at least one sensor signal may be understood to mean a filtering of mathematical operations such as a derivation, integration, or multiple integration of multiple derivation, or other arithmetic operations. An example of such a characteristic is, for example, the integrated acceleration of an acceleration sensor system. In general, the two characteristics are different; however, they may also be identical.

The mapping of the at least two characteristics onto a single value range is to be understood as the normalizing of these two characteristics on this one value range. That is, for example, a value range of 0 to a power of two, e.g., $2^{16}$, is defined, and the characteristics that are defined by crashes in terms of their value are normalized to this value range. Thus, it is possible for functions that process these characteristics for the evaluation for the triggering of passenger protection means to perform their calculations always with only one single value range, and an adjustment with regard to different value ranges is not necessary.

These at least two mapped characteristics then enter into the triggering algorithm, which is characterized by time-dependent and/or time-independent thresholds, for example. It is also possible for variables other than the characteristics to influence the level of the thresholds or characteristic curves. Different classification methods may also be used in this instance.

A control device for triggering passenger protection means is predominantly understood to mean an electric device that processes the at least one sensor signal and generates a triggering signal for triggering passenger protection means as a function thereof. The control device accordingly has corresponding analog and/or digital computing means.

In the case at hand, it also has at least one interface that provides the at least one sensor signal of the accident sensor system. The accident sensor system may be situated inside of and/or outside of the control device. That is, the interface may be designed as hardware, for example, as part of an ASIC, but may also be designed as software, and in this context may be designed as a software module, for example, on a microcontroller.

The software and/or hardware design may also be used for the analysis circuit for generating the at least two characteristics from the at least one sensor signal, for the mapping circuit for mapping the at least two characteristics onto the one value range, and for the triggering circuit for generating the triggering signal as a function of the at least two mapped characteristics. That is, these circuits may be software modules on a microcontroller; however, they may also respectively be situated on an ASIC, for example, as hardware circuits. A combination of hardware and software designs is also possible in the case at hand.

Advantageous improvements of the method and control device for triggering passenger protection means for a vehicle recited in the independent claims are rendered possible by the measures and further refinements recited in the dependent claims.

It is advantageous that the mapping takes place through a division, with regard to value, of the at least two characteristics. The division, with regard to value, means that the at least two characteristics that exist as numbers in the microcontroller, for example, are mapped onto the individual value range by a corresponding division. The simplest division is a halving, which may preferably occur through a so-called bit shift. However, other divisions are also possible. The halving has the advantage that it can be designed in a particularly simple manner; however, it involves a loss of information.

Alternatively, it is advantageously possible to implement the mapping using a so-called numerator-denominator method. For this purpose, the at least two characteristics are respectively multiplied by a predefined fraction. Thus, it is a particular type of division. The denominator of this fraction may advantageously take the form of a power of two. At present, it is possible to implement a power of two on a microcontroller or another computer approximately 80 times more quickly than a division. An example for such a denominator is $2^5=32$. The numerator of this fraction may advantageously be determined as a function of a factor that multiplies a maximum value of the respective characteristic to the next higher power of two. This means that the measured maximum value of a characteristic is multiplied to the next higher power of two. This factor then determines the numerator, it then being possible to use an integer for the numerator, in that this factor is multiplied by the denominator, which is a power of two, for example. Through the multiplication of the characteristic with this fraction formed in this manner, one arrives at the next higher power of two and through a division, for example, by two, the final normalization and mapping onto the single value range occurs.

An additional advantageous design is that prior to the mapping the at least two characteristics are enlarged or also scaled up. This may be by 10%, for example, this scaling up being advantageous in that real crashes are also mapped, since the size of the characteristics in the training data, which may be used in labs, in particular in machine-learning-based methods, is exceeded in real crashes. Apart from this, through the scaling up, deviations in the sensor signal, for example, through temperature drift, installation inaccuracies, or aging, are taken into account by the scaling up.

Advantageously, an exchange of the at least two characteristics and/or a switching on and/or switching off of functions for these characteristics is implemented as a function of an evaluation of the at least two characteristics. The mapping onto the single value range simplifies the exchangeability of the characteristics, so that if it emerges that a functional module does not provide a sufficient contribution to the algorithm performance, this module may be simply exchanged, without the value range of the characteristics having to be adjusted. This is illustrated by the following examples:

EXAMPLE 1

If the vehicle front structure changes significantly, for example, in the vehicle development process, then this has effects on the crash characteristics. Recently, there has been a tendency to shorten the front structure, at the same time stiffening it. Characteristics that take into account high frequencies in the acceleration signal tend to be better suited to this new structure. The adjustment to these new characteristics is more easily possible with the described exchange.

EXAMPLE 2

As part of the development, process of a vehicle, a sensor, for example, an upfront sensor, may be eliminated, for example. Characteristics that detect offset crashes through upfront sensor pairs thus become ineffective. These characteristics may then be replaced by better characteristics (e.g., obtained from rotation-rate sensors for offset detection), without significantly influencing the software architecture.

EXAMPLE 3

As part of the crash sequence, functionality may be switched on or switched off in a targeted manner. For example, if a full-frontal crash can be ruled out after a certain crash duration, functionality could be switched on that detects slower crashes, for example, with a small overlap or central or non-central collisions into a post. The crash types that were last mentioned may also be triggered later. This example is covered by the patent application DE102007004345A1 by Hiemer and Kolatschek. The present patent application significantly simplifies the sequence control described there, with time-controlled and/or event-controlled switching off and switching on of functionality.

Exemplary embodiments of the present invention are illustrated in the drawing and are explained in greater detail in the following description.

DETAILED DESCRIPTION OF THE INVENTION

Figure 1:
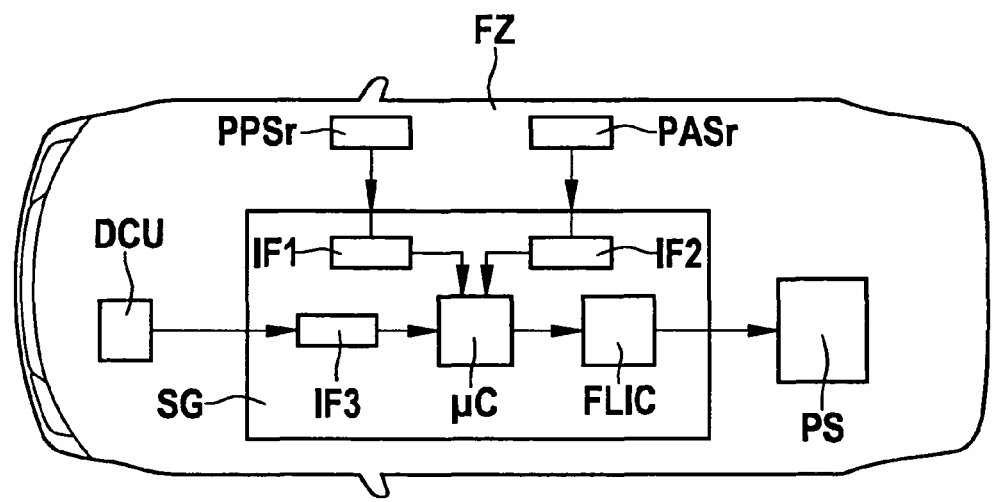
FIG. 1 shows a block diagram of the control device according to the present invention having connected components in a vehicle.

FIG. 1 illustrates in a block diagram control device SG according to the present invention in a vehicle FZ. Components are attached to the control device in order to guarantee the function of this control device for triggering passenger protection means. In the case at hand, only the components necessary to gain an understanding of the present invention are shown. Other components necessary for the operation of control device SG, such as an energy supply, for example, have been omitted for the sake of simplicity. However, the design of these components is known to one skilled in the art, from the related art.

An air-pressure sensor system PPSr is connected to an interface IF1 in control device SG. This air-pressure sensor system PPSr is situated in the side section of the vehicle, namely on the right side. This air-pressure sensor system PPSr is used to detect a lateral impact. For the sake of simplicity, in this instance, only the air-pressure sensor system on the right side of the vehicle is illustrated. In reality, an additional air-pressure sensor system is also situated on the left side; however, it was likewise omitted for the sake of simplicity in the case at hand. This is also true for acceleration sensor system PASr, which is connected to interface IF2 in control device SG, and is located in the region of the center pillar of vehicle FZ, for example. Furthermore, a so-called sensor cluster DCU is connected to control device SG, which has many different sensors, such as acceleration sensors, rotation-rate sensors, and/or structure-borne noise sensors. This sensor cluster DCU is connected to interface IF3. Interfaces IF1, IF2, and IF3 may be designed separately as hardware modules, or also on an ASIC as individual sections on this ASIC. It is furthermore possible to represent at least parts or some of these interfaces as software modules. In the case at hand, only one section of the available sensor system is shown. Additional sensor systems may also be connected to control device SG and sensor systems may also be located inside of control device SG.

Interfaces IF1, IF2, and IF3 are connected to a microcontroller μC in control device SG, for example, via the so-called SPI (serial peripheral interface bus). The SPI bus is a serial bus that is made up of five parallel lines, a first line being provided for data transmission from a slave to a master (MISO), a second line being provided for data transmission from the master to the slave (MOSI), a third line being provided for selecting the slave (CS), an enable line being provided and a clock line being provided.

Microcontroller μC implements the method according to the present invention and as a function of the sequence of this method generates a triggering signal, which is also transmitted via the SPI bus to a triggering circuit FLIC, for example, which results in the activation and triggering of passenger protection means PS, through a supply of power, for example. Triggering circuit FLIC may also be part of a system ASIC, as may interfaces IF1 to 3.

As already indicated above, additional components of control device SG and also a separate evaluation path are omitted for the sake of simplicity.

Figure 2:
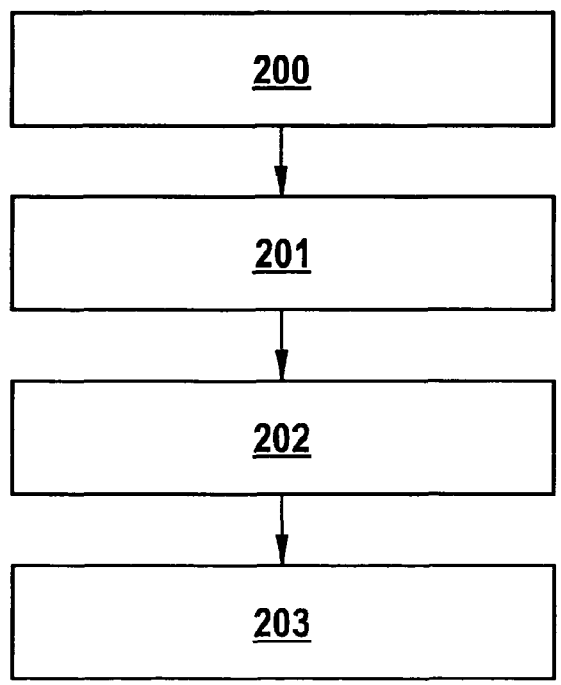
FIG. 2 shows a first flow chart.

FIG. 2 shows the sequence of the method according to the present invention in a first flow chart. In method step 200, interfaces IF1 to 3 provide the at least one sensor signal, so that microcontroller μC reads in these signals, preferably digitally, via the SPI bus, and is able to process them.

In method step 201, microcontroller μC implements initially the generation of the at least two characteristics from the at least one sensor signal. In this context, microcontroller μC or another module that implements the generation of the at least two characteristics, for example, from an acceleration signal, may evaluate as characteristics a filtered acceleration signal, an integrated acceleration, a twice integrated acceleration, a derivation of the acceleration, a maximum value acceleration, an average value of the acceleration, or other signal characteristics as characteristics. This may be done accordingly for the air pressure signal of air pressure sensor system PPSr, it also being possible to generate from the air pressure signal the integrated air pressure signal and the like, for example, as characteristics. Signal characteristics such as the so-called closing velocity, that is, the impact speed, time to impact, and other parameters may also be obtained as characteristics from signals of a surroundings sensor system.

Then in method step 202, the mapping of the at least two characteristics onto the one value range occurs. As illustrated above, this may take place through a simple division or through the so-called numerator-denominator method. However, it is also possible to use other mapping techniques in the case at hand. For example, truncating or adding to the value range of the characteristics or also separating the value range of the characteristic, which is then further used as a value range. The forming of the triggering decision in method step 203 then takes place using these mapped characteristics. The triggering of passenger protection means takes place as a function of this triggering decision, as specified above.

Figure 3:
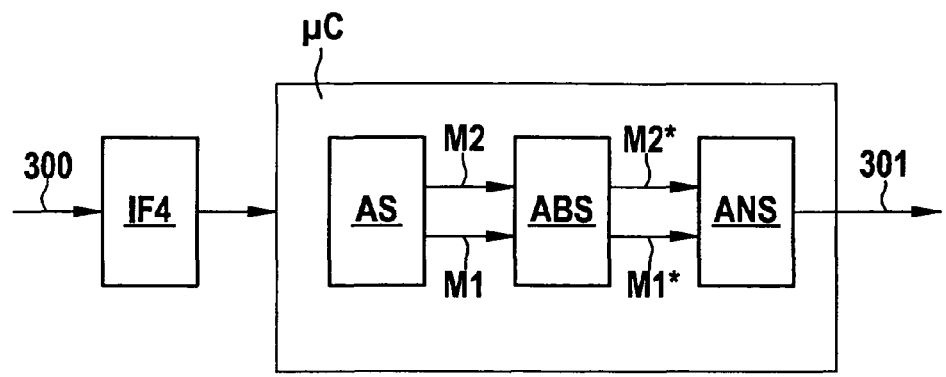
FIG. 3 shows a first block diagram.

FIG. 3 explains in detail in a block diagram how the inventive part of the control device runs. The at least one sensor signal 300 is provided by interface IF4, namely to microcontroller μC, which has analysis circuit AS, as a software module, for example, which generates from the at least one sensor signal 300 the characteristics M1 and M2. These characteristics M1 and M2 are input in mapping circuit ABS, which implements the mapping onto the at least one value range, as indicated above. The characteristics M1* and M2* mapped in this manner are supplied to triggering circuit ANS, which implements triggering signal 301 as a function of these mapped characteristics M1* and M2*. In the case at hand, the two characteristics are only exemplary. The method according to the present invention and the control device according to the present invention are suitable in particular for a greater number of characteristics.

Figure 4:
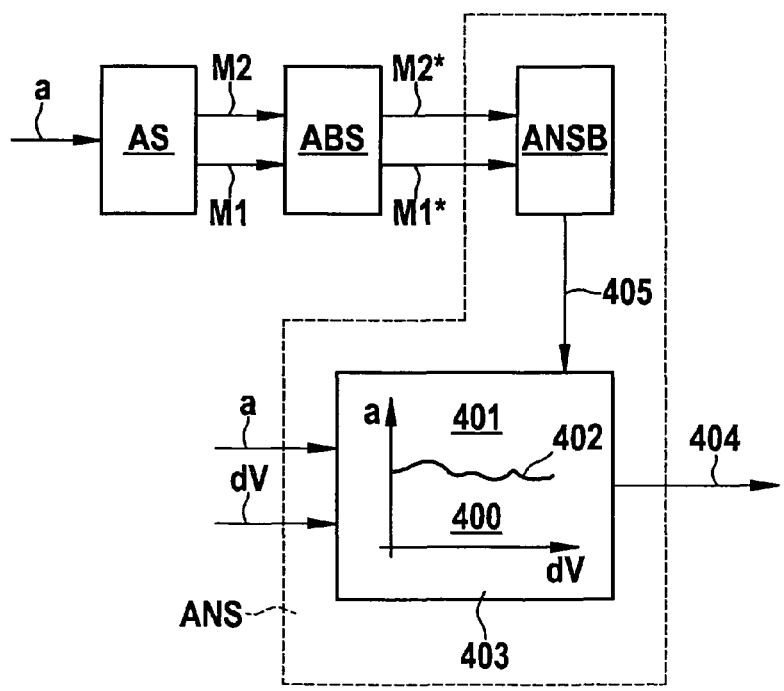
FIG. 4 shows a second block diagram.

FIG. 4 illustrates this part of the control device in connection with a concrete triggering algorithm 403. However, the present invention may also be part of the triggering algorithm itself. The at least one sensor signal a, in the case at hand, the acceleration signal, enters analysis circuit AS, which generates the at least two characteristics M1 and M2, for example, the forward displacement and the speed reduction, through double or simple integration as characteristics. Mapping circuit ABS then performs the mapping of these two characteristics M1 and M2 onto the one single value range and thereby generates characteristics M1* and M2*, which enter into influence circuit ANSB, which is part of triggering circuit ANS. This influence circuit ANSB generates an influence signal 405, which influences a characteristic curve 402 in triggering algorithm 403. This characteristic curve 402 separates triggering cases 401 from non-triggering cases 400 in an acceleration speed-reduction diagram. Value pairs of acceleration a and of speed reduction dV enter into this diagram. The position of these value pairs is then compared to characteristic curve 402, and it is determined whether these value pairs indicate a release or triggering case. It is therefore clear that the position of characteristic curve 402 determines whether a certain value pair indicates a triggering case for the airbags. If a triggering case is identified, triggering algorithm 403 outputs triggering signal 404, which then results in the triggering of passenger protection means.

Figure 5:
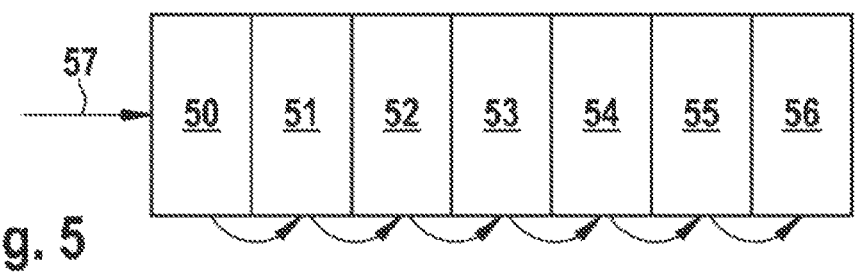
FIG. 5 shows a register.

FIG. 5 illustrates a bit register 57 having consecutive bit positions 50 through 56, 50 being the bit having the highest value and 56 having the lowest value. A division of a characteristic, and thus a mapping onto a single value range, is achieved by a simple bit shift, indicated by the arrows. This is a particularly simple method, which also results in a loss of information in the respective characteristic through the mapping, however.

Figure 6:
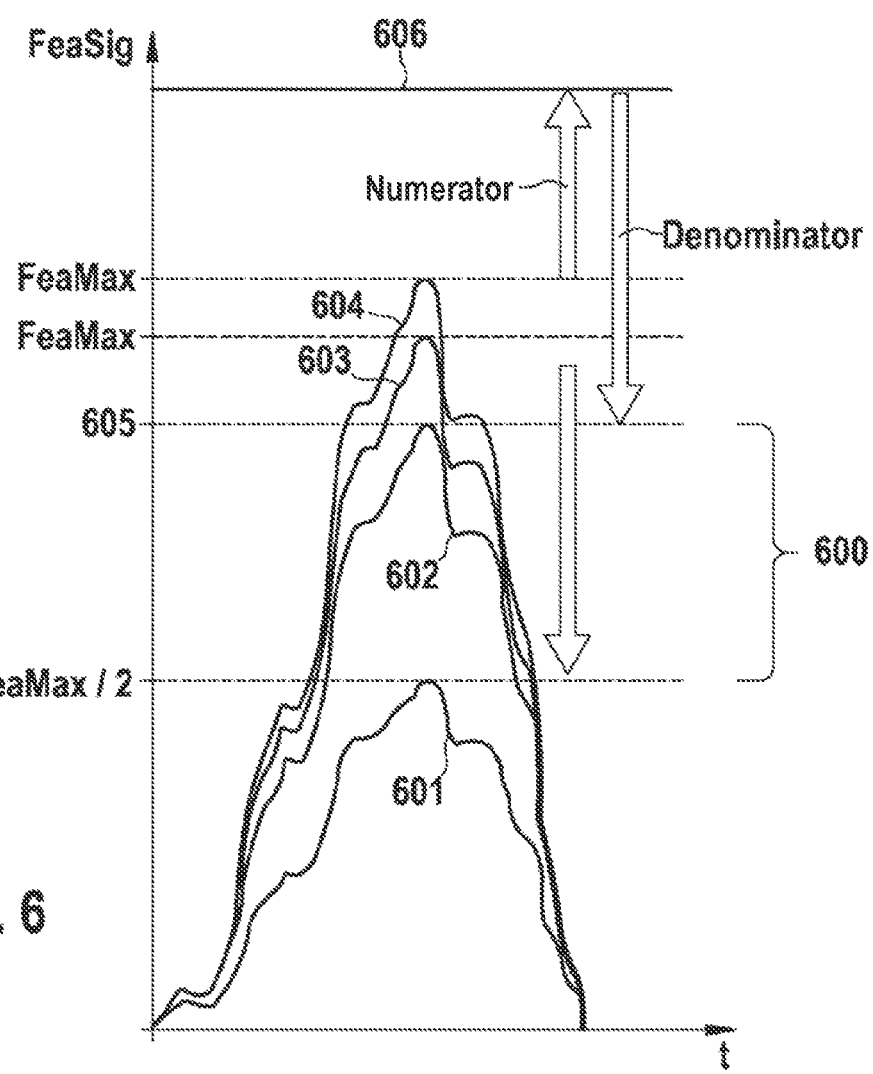
FIG. 6 shows a characteristic time diagram.

With regard to the classification, the so-called numerator-denominator method achieves a better quality, which is explained in FIG. 6 with the aid of a signal time diagram. The characteristic curve is represented in the case at hand by reference symbol 603. The characteristic curve be limited (=normalized) to the signal range that is determined by maximum value 605. A particularly resource-saving method for mapping signal 603 in the range that is described by maximum value 605 consists in applying a simple bit shift to the right to signal curve 603. This results in the signal described by reference symbol 601. Bracket 600 indicates the range that is lost by this mapping. There is thus a loss of signal information in this instance, but the mapping itself is implemented in the simplest manner and thus saves the resources of the microcontroller or other computing means in control device SG.

A more precise method, compared to the simple bit shift method, having significantly lower loss of signal information is provided when the signal curve of characteristic 603 is mapped onto signal curve 602. Then the target value range, which is limited in the upward direction by value 605, is clearly better utilized. In order to map signal 603 onto signal 602, signal 603 is first scaled up by 10%, for example, for the above reasons, which results in signal curve 604. Now, scaled-up signal curve 604 is advantageously further processed using the numerator-denominator method. Initially, scaled-up signal 604 is scaled, by multiplication with the numerator, up to the next higher power of two, for example, which is described by reference symbol 606. Subsequently, starting from the signal curve multiplied up to 606, the signal is mapped onto target curve 602 by dividing it by the denominator. The denominator is advantageously a power of 2. In this case, the division may be mapped on the microcontroller or another computing means in control device SG in a cost-effective manner through a shift operation.

By applying the numerator-denominator method, the value range limited by 604 is thus utilized in the best manner possible.

In the event that the maximum value of signal 603 is below target value range 605, the described process occurs in a completely analog manner. In this case, as well, the signal curve is adjusted in an optimal manner to the value range defined by 605.

The numerator-denominator method thus works for normalization "in an upward direction" when the target value range is greater than the maximum value of the characteristic. The numerator-denominator method likewise works for normalization "in a downward direction" when the target value range is less than the maximum value of the characteristic.

Figure 7:
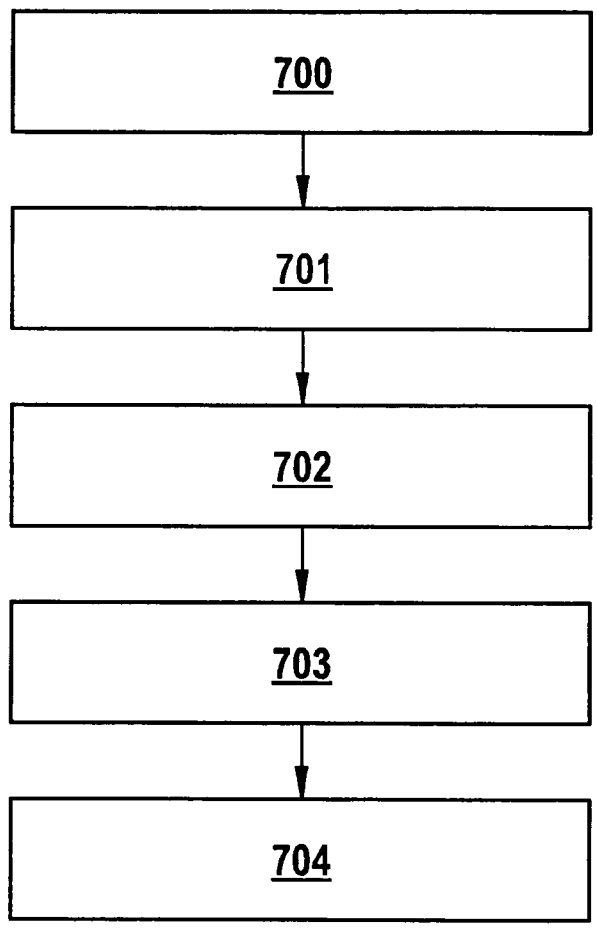
FIG. 7 shows a second flow chart.

The method according to the present invention is shown in an additional flow chart in FIG. 7. In method step 700, the determination of the maximum characteristic value is implemented for all selected characteristics during the calibration. In method step 701, the numerator and the denominator are determined by a so-called look-up table. The numerator value and denominator value are stored in EEPROM, for example, namely in method step 702. Steps 700 to 702 occur in the lab, while the subsequent steps 703 and 704 occur in the control device. Characteristic values are multiplied by the fraction in method step 703, and the classification and thus the decision as to whether the passenger protection means are to be triggered or not occurs using these mapped characteristics in method step 704.

What is claimed is:

1. A method for triggering a passenger protection arrangement comprising:
providing at least one sensor signal of an accident sensor system; and
generating at least two characteristics from the at least one sensor signal;
wherein the at least two characteristics are mapped onto one single value range, and
wherein the passenger protection arrangement is triggered as a function of the at least two mapped characteristics.

2. The method as recited in claim 1, wherein the mapping takes place through a division-of the at least two characteristics.

3. The method as recited in claim 1, wherein the division-takes place through a bit-shift.

4. The method as recited in claim 2, wherein the mapping takes place through a numerator-denominator method, in which the at least two characteristics are respectively multiplied by a predefined fraction; the predefined fraction being representable by a numerator and a denominator.

5. The method as recited in claim 4, wherein a power of two is used as the denominator of the predefined fraction.

6. The method as recited in claim 1, wherein the mapping takes place through a numerator-denominator method, in which the at least two characteristics are respectively multiplied by a predefined fraction; the predefined fraction being representable by a numerator and a denominator.

7. The method as recited in claim 6, wherein a power of two is used as the denominator of the predefined fraction.

8. The method as recited in claim 7, wherein the numerator of the predefined fraction is determined as a function of a factor, the factor multiplying a maximum value of the respective characteristic to the next higher power of two.

9. The method as recited in claim 8, wherein the numerator is an integer.

10. The method as recited in claim 6, wherein the numerator of the predefined fraction is determined as a function of a factor, the factor multiplying a maximum value of the respective characteristic to the next higher power of two.

11. The method as recited in claim 10, wherein the numerator is an integer.

12. The method as recited in claim 1, wherein the at least two characteristics are enlarged prior to the mapping.

13. The method as recited in claim 1, wherein at least one of: an exchange of the at least two characteristics, and a switching on or switching off of functions takes place as a function of an evaluation of the at least two characteristics.

14. A control device for triggering a passenger protection arrangement, comprising:
an interface that provides at least one sensor signal of an accident sensor system;
an analysis circuit that is configured to generate at least two characteristics from the at least one sensor signal;
a mapping circuit in the control device that is configured to map the at least two characteristics onto one single value range; and
a triggering circuit that is configured to generate a triggering signal for triggering the passenger protection arrangement as a function of the at least two mapped characteristics.

15. The device as recited in claim 14, wherein the mapping circuit is further configured to map the at least two characteristics through a division of the at least two characteristics.

16. The device as recited in claim 15, wherein the division takes place through a bit-shift.

17. The device as recited in claim 15, wherein the mapping circuit is further configured to map the at least two characteristics through a numerator-denominator method, in which the at least two characteristics are respectively multiplied by a predefined fraction, and wherein the predefined fraction is representable by a numerator and a denominator.

18. The device as recited in claim 17, wherein the denominator of the predefined fraction is a power of two.

19. The device as recited in claim 15, wherein the mapping circuit is further configured to map the at least two characteristics through a numerator-denominator method, in which the at least two characteristics are respectively multiplied by a predefined fraction, and wherein the predefined fraction is representable by a numerator and a denominator, wherein a power of two is used as the denominator of the predefined fraction, and wherein the numerator of the predefined fraction is determined as a function of a factor, the factor multiplying a maximum value of the respective characteristic to the next higher power of two.

20. The device as recited in claim 19, wherein the numerator is an integer.

21. The device as recited in claim 14, wherein the mapping circuit is further configured to map the at least two characteristics through a numerator-denominator method, in which the at least two characteristics are respectively multiplied by a predefined fraction, and wherein the predefined fraction is representable by a numerator and a denominator.

22. The device as recited in claim 21, wherein the denominator of the predefined fraction is a power of two.

23. The device as recited in claim 22, wherein the numerator of the predefined fraction is a function of a factor, the factor multiplying a maximum value of the respective characteristic to the next higher power of two.

24. The device as recited in claim 23, wherein the numerator is an integer.

25. The device as recited in claim 21, wherein the numerator of the predefined fraction is a function of a factor, the factor multiplying a maximum value of the respective characteristic to the next higher power of two.

26. The device as recited in claim 25, wherein the numerator is an integer.

27. The device as recited in claim 14, further configured to enlarge the at least two characteristics prior to the mapping.

28. The device as recited in claim 14, wherein the device is further configured to perform at least one of: an exchange of the at least two characteristics and a switching on or switching off of functions as a function of an evaluation of the at least two characteristics.

29. The device as recited in claim 14, wherein the mapping circuit is further configured to map the at least two characteristics through a division of the at least two characteristics, and wherein the division takes place through a bit-shift, and wherein device is further configured to enlarge the at least two characteristics prior to the mapping.

30. The device as recited in claim 29, wherein the device is further configured to perform at least one of: an exchange of the at least two characteristics and a switching on or switching off of functions as a function of an evaluation of the at least two characteristics.

31. The device as recited in claim 14, wherein the mapping circuit is further configured to map the at least two characteristics through a numerator-denominator method, in which the at least two characteristics are respectively multiplied by a predefined fraction, and wherein the predefined fraction is representable by a numerator and a denominator, wherein a power of two is used as the denominator of the predefined fraction, and wherein the numerator of the predefined fraction is determined as a function of a factor, the factor multiplying a maximum value of the respective characteristic to the next higher power of two.

32. The device as recited in claim 31, wherein the numerator is an integer.

33. The device as recited in claim 14, wherein the device is further configured to enlarge the at least two characteristics prior to the mapping, and wherein the device is further configured to perform at least one of: an exchange of the at least two characteristics and a switching on or switching off of functions as a function of an evaluation of the at least two characteristics.

* * * * *